United States Patent
Fan et al.

(10) Patent No.: US 10,872,178 B2
(45) Date of Patent: Dec. 22, 2020

(54) PROCESSING 3D OBJECTS

(71) Applicant: Hewlett-Packard Development Company, L.P., Spring, TX (US)

(72) Inventors: Jian Fan, Palo Alto, CA (US); Jun Zeng, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/349,669

(22) PCT Filed: Jan. 29, 2017

(86) PCT No.: PCT/US2017/015532
§ 371 (c)(1),
(2) Date: May 14, 2019

(87) PCT Pub. No.: WO2018/140046
PCT Pub. Date: Aug. 2, 2018

(65) Prior Publication Data
US 2019/0337231 A1 Nov. 7, 2019

(51) Int. Cl.
G06F 30/00 (2020.01)
G06T 17/00 (2006.01)
B29C 64/386 (2017.01)
B33Y 50/00 (2015.01)

(52) U.S. Cl.
CPC ............ *G06F 30/00* (2020.01); *B29C 64/386* (2017.08); *G06T 17/00* (2013.01); *B33Y 50/00* (2014.12)

(58) Field of Classification Search
None
See application file for complete search history.

(56) References Cited

U.S. PATENT DOCUMENTS

| | | | |
|---|---|---|---|
| 7,188,103 B2 | 3/2007 | Furuhashi et al. | |
| 7,397,473 B2 | 7/2008 | Chakraborty | |
| 8,606,774 B1 | 12/2013 | Makadia et al. | |
| 9,348,877 B2 | 5/2016 | Ramani et al. | |
| 10,466,681 B1 * | 11/2019 | Jones | G05B 19/40937 |
| 2014/0324904 A1 | 10/2014 | Yamamoto | |
| 2015/0165685 A1 | 6/2015 | Klappert et al. | |
| 2015/0205544 A1 | 7/2015 | Webb et al. | |

(Continued)

FOREIGN PATENT DOCUMENTS

WO WO-2016169618 A1 10/2016

OTHER PUBLICATIONS

D.V. Vranic, D. Saupe, J. Richter, Tools for 3D-object Retrieval: Karhunen-Loeve Transform and Spherical Harmonics, Oct. 5, 2001, IEEE Fourth Workshop on Multimedia Signal Processing, pp. 293-298.*

(Continued)

*Primary Examiner* — Robert Bader
(74) *Attorney, Agent, or Firm* — Nathan R. Rieth

(57) ABSTRACT

In an example implementation, a method of processing a 3D object includes receiving a 3D object model representing a new 3D object to be processed. The method includes computing attributes of the object and comparing the object attributes with stored object attributes from previously processed 3D objects. When the comparison provides a match between the object attributes and stored object attributes, then a print recipe associated with the matching stored object attributes is retrieved.

8 Claims, 6 Drawing Sheets

(56) References Cited

U.S. PATENT DOCUMENTS

2015/0331402 A1 11/2015 Lin et al.
2016/0059489 A1 3/2016 Wang et al.

OTHER PUBLICATIONS

Jonathan Corney, Heather Rea, Doug Clark, John Pritchard, Michael Breaks, Roddy MacLeod, "Coarse Filters for Shape Matching", 2002, IEEE, IEEE Computer Graphics and Applications, vol. 22, Issue 3, pp. 65-74.*

Benjamin Bustos, Daniel A. Keim, Deitmar Saupe, Tobias Schreck, Dejan V. Vranic, "Feature-Based Similarity Search in 3D Object Databases", Dec. 2005, ACM, ACM Computing Surveys, vol. 37, No. 4, pp. 345-387.*

Rui Huang, Shusheng Zhang, Xiaoliang Bai, Changhong Xu, Bo Huang, "An effective numerical control machining process reuse approach by merging feature similarity assessment and data mining for computer-aided manufacturing models", 2015, SAGE, Proceeding.*

Ding-Yun Chen, Xiao-Pei Tian, Yu-Te Shen, Ming Ouhyoung, "On Visual Similarity Based 3D Model Retrieval", Sep. 2003, Eurographics, Computer Graphics Forum, vol. 22, Issue 3, pp. 223-232.*

Helin Dutagaci, Bülent Sankur, Yücel Yemez, "Subspace methods for retrieval of generic 3D models", Aug. 2010, Elsevier, Computer Vision and Image Understanding, vol. 114, Issue 8, pp. 865-886.*

Ryutarou Ohbuchi, Tomo Otagiri, Masatoshi Ibato, Tsuyoshi Takei, "Shape-Similarity Search of Three-Dimensional Models Using Parameterized Statistics", Oct. 2002, IEEE, Proceedings 10th Pacific Conference on Computer Graphics and Applications, 2002,.*

Pu Jiantao, Liu Yi, Xin Guyu, Zha Hongbin, Liu Weibin, Yusuke Uehara, "3D Model Retrieval Based on 2D Slice Similarity Measurements", Sep. 9, 2004, IEEE, Proceedings. 2nd International Symposium on 3D Data Processing, Visualization and Transmission, 2004.*

Hilaga, M., et al, Topology Matching for Fully Automatic Similarity Estimation of 3d Shapes, Aug. 1, 2001, < http://dl.acm.org/citation.cfm?id=383282 >.

Osada, R., et al, Matching 3D Models with Shape Distributions, May 7-11, 2001, < http://ieeexplore.ieee.org/document/923386/?arnumber=923386 >.

* cited by examiner

PROCESSING 3D OBJECTS

BACKGROUND

Additive manufacturing generally refers to processes that use digital data models to define objects that are fabricated by adding material, layer upon layer. Additive manufacturing encompasses a range of three-dimensional (3D) printing technologies including stereolithography, digital light processing, fused deposition modeling, and selective laser sintering. When compared to other manufacturing processes such as machining and injection molding, additive manufacturing processes enable increased complexity and customization of objects. The increased complexity and customization enabled by additive processes apply to both external object characteristics, such as shape, texture, and color, as well as internal object characteristics, such as strength, elasticity, and material composition. Thus, additive manufacturing processes such as 3D printing enable the production of heterogeneous objects that can meet virtually any design objective through interior object volumes that comprise different materials, varying material densities, varying arrangements of empty and filled volume spaces, and so on.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
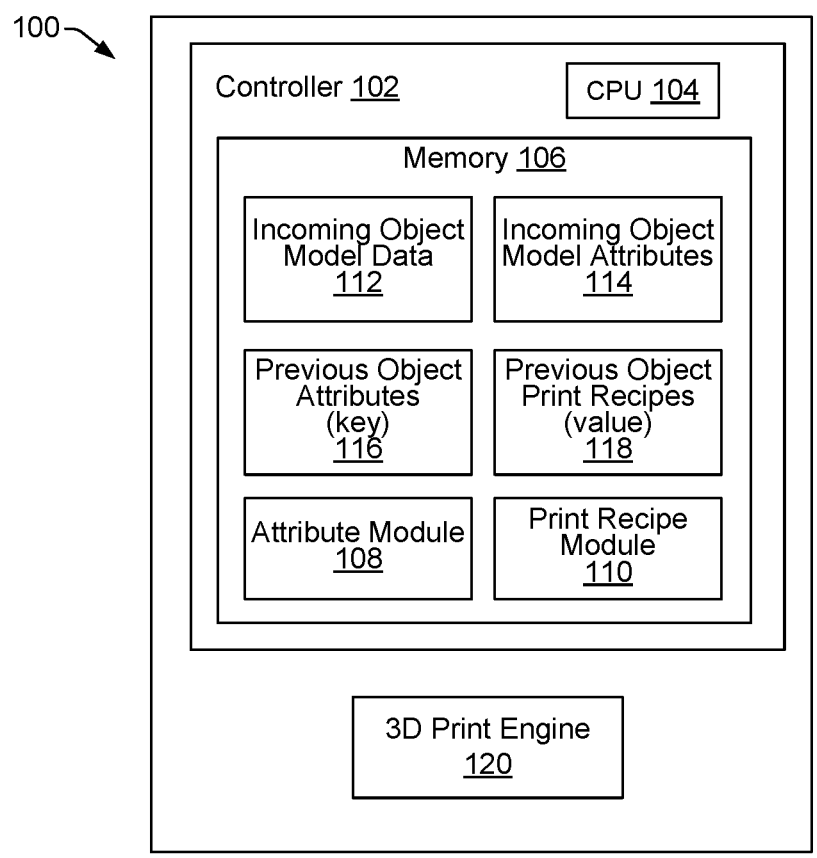
FIG. 1 shows an example of a 3D printing system for processing 3D objects that is suitable to perform an automatic comparison of two heterogeneous 3D objects to enable the retrieval and reuse of a previously created print recipe.

Providers of three-dimensional (3D) printing services produce objects according to 3D object model data received from customers. The 3D object model data can specify various object attributes or properties requested by the customer, such as the object's shape, size, color, strength, elasticity, material composition, and so on. A 3D print service provider (PSP) can use the specified object attributes to design a print recipe (i.e., fabrication recipe) that can be used to generate a heterogeneous 3D object that achieves the specified object attributes. The print recipe can then be processed to generate instructions that are executable by a 3D printing device to print the physical 3D object.

Generating a print recipe for each new incoming object involves significant processing of the 3D object model data received from a customer. For each new 3D object model received, data slices can be taken through the data structure with each slice representing an image or an array of pixels. Each pixel can contain an array of attribute values, with each value representing a property, such as whether the pixel is on the inside or the outside of the object. For each pixel that is represented by an array of attribute values that represent different properties, a material can be selected from a material library. A set of printing process settings can be chosen to deposit the selected material onto the pixel under a selected printing condition that results in physical properties that match the values specified by the array of properties associated with the pixel. Printing process settings can include many different parameters including, for example, the layer thickness of the selected material, the type of fusing or binding agent to apply to the material, the amount of fusing agent to apply, the application resolution to use when applying the agent, the amount of fusing energy to apply to the print bed, the duration and intensity of fusing energy applications, and so on. For all the slices and all the pixels, the material and process conditions are determined. Collectively, these material and process conditions form the print recipe.

Unfortunately, generating a print recipe to control the fabrication of each new incoming heterogeneous 3D object can be time consuming and costly. In some examples, generating a print recipe can take several iterations. Thus, reusing previously generated print recipes can help print service providers reduce the time and cost associated with generating print recipes for each new incoming 3D object. Accordingly, examples of processing 3D objects described herein provide for efficient, effective, automatic comparison of two heterogeneous 3D objects to enable maximum reuse of previously created print recipes. The reuse of previously generated print recipes minimizes print process variations and shortens the overall recipe development time for print service providers. The automatic comparison of incoming heterogeneous object models to previously created objects includes geometric comparisons as well as comparisons of all material properties stored within the volumetric interiors of previously created objects. The automatic comparisons help to maximize the reuse of previously generated printing recipes by selecting the most similar parts that have been fabricated previously and using their print recipes as "blue prints" for new incoming objects.

In a particular example, a method of processing a 3D object includes receiving a 3D object model representing a new 3D object to be processed. The method includes computing attributes of the object and comparing the object attributes with stored object attributes from previously processed 3D objects. When the comparison provides a match between the object attributes and stored object attributes, then a print recipe associated with the matching stored object attributes is retrieved. The print recipe can be used as a guide to printing the new 3D object.

In another example, a non-transitory machine-readable storage medium stores instructions that when executed by a processor of a system for processing a 3D object, cause the system to receive digital data representing a new object to be printed, and to normalize an alignment of the new object to enable a comparison of attributes of the new object with previous object attributes stored in a memory of the system. The system further computes attributes of the new object and compares attributes of the new object with previous object attributes. When a match is found between the new object attributes and the previous object attributes, the system retrieves a print recipe associated with the matching previous object attributes and prints the new object using the print recipe. When no match is found, the system generates a new print recipe for the new object and prints the new object using the new print recipe.

In another example, a 3D printing system for processing 3D objects includes a memory device comprising previous object attributes and associated previous object print recipes from previously processed 3D objects. The printing system further includes a processor programmed with instructions from an attribute module that are executable by the processor to compute attributes of an incoming object model that represents a new 3D object. The instructions are further executable by the processor to compare the incoming object attributes with the previous object attributes and to retrieve a previous object print recipe when a match is found. The printing system includes a 3D print engine to print the new 3D object based on the retrieved previous object print recipe.

FIG. 1 shows an example of a 3D printing system 100 for processing 3D objects that is suitable to perform an automatic comparison of two heterogeneous 3D objects to enable the retrieval and reuse of a previously created print recipe. As shown in FIG. 1, an example 3D printing system 100 can include a controller 102 with a processor (CPU) 104 and a memory device 106. The memory 106 can include both volatile (i.e., RAM) and nonvolatile memory components (e.g., ROM, hard disk, optical disc, CD-ROM, magnetic tape, flash memory, etc.). The components of memory 106 comprise non-transitory, machine-readable (e.g., computer/processor-readable) media that can provide for the storage of machine-readable coded program instructions, data structures, program instruction modules, JDF (job definition format), and other data and/or instructions executable by a processor 104 of the 3D printing system 100. In some examples the controller 102 may additionally include other electronics (not shown) for communicating with and controlling various components of the 3D printing system 100. Such other electronics can include, for example, discrete electronic components and/or an ASIC (application specific integrated circuit).

Examples of executable instructions to be stored in memory 106 include instructions associated with an attribute module 108 and a print recipe module 110. Examples of data stored in memory 106 can include incoming object model data 112, incoming object model attributes 114, prior object attributes 116, and prior object print recipes 118. In general, modules 108, 110, 112, 114, 116, and 118, include programming instructions and/or data executable by a processor 104 to cause the controller 102 of 3D printing system 100 to perform operations related to printing 3D objects through the control of a 3D print engine 120. Moreover, such programming instructions and data can be executable to perform operations that compare two heterogeneous 3D objects to enable the retrieval and reuse of a previously created print recipe, as described in more detail below.

Thus, the controller 102 can control various operations of the 3D printing system 100 to facilitate the printing of 3D objects with a 3D print engine 120. In different examples, a 3D print engine 120 may implement different 3D printing technologies that use incoming object model data 108 to print 3D objects through additive, layer-by-layer processes. Different 3D printing technologies can use different materials, components, and methods to create 3D objects. Such 3D printing technologies can include, but are not limited to, stereolithography (SLA), selective laser sintering (SLS) color-jet printing (CJP), fused deposition modeling (FDM), multi-jet printing (MJP), and direct metal sintering (DMS). Thus, the 3D printing system 100 is not limited to a particular type of 3D printing technology. Rather, different examples of the 3D printing system 100 may print 3D objects using any of a variety of different 3D printing technologies.

In one example, the 3D print engine 120 implements an additive, layer-by-layer print process that spreads thin layers of powdered build material over a print platform within a work area. Thus, the print engine 120 can include a supply of powdered material and a spreader (e.g., a blade or roller) to repeatedly spread material as layers of a 3D object are formed. The print engine 120 can include a liquid agent dispenser such as a drop-on-demand printhead to enable the selective delivery of a fusing agent or other liquid where the powdered material particles are to fuse together. The print engine 120 can further include a source of fusing energy, such as a heating lamp or other radiation source, to provide fusing energy that can fuse together the powdered material in those areas where fusing agent has been dispensed.

Referring still to FIG. 1, in addition to controlling the 3D print engine 120 to create 3D objects, controller 102 can execute instructions from modules 108 and 110 with regard to data in modules 112, 114, 116, and 118, to perform operations that can automatically compare two heterogeneous 3D objects to enable the retrieval and reuse of a previously created print recipe. As noted above, the reuse of print recipes for fabricating/printing new incoming heterogeneous 3D objects can save time and costs for 3D print service providers. A print recipe generally comprises a collection of material and printing process conditions generated based on object attributes and properties computed from 3D object model data. The collection of material and printing process conditions (i.e., the print recipe) prescribe how the 3D print engine 120 will operate or be controlled to enable printing/fabrication of a 3D object whose attribute values and/or physical properties comply with the incoming 3D object model data. The print recipe can be processed to generate instructions executable by controller 102 that control the 3D print engine 120.

When incoming 3D object model data 112 is received by the 3D printing system 100, controller 102 can execute instructions from attribute module 108 to compute attributes of the 3D object from the object model data 112. Geometric and material property attributes of the outside surface and the volumetric interior of the 3D object can be computed. When attributes of the incoming 3D object model are computed, they can be compared with previously computed object attributes 116 from previously printed 3D objects. When object attributes from a previous object are found that match the incoming 3D object model, a previously generated print recipe 118 associated with the matching previous object attributes can be retrieved and used as a basis for printing the incoming 3D object. Thus, the previous object attributes 116 and previous object print recipes 118 operate within memory 106 as a "key-value pair" in which the previous object attributes 116 provide unique identifiers for previous object print recipes 118.

Figure 2:
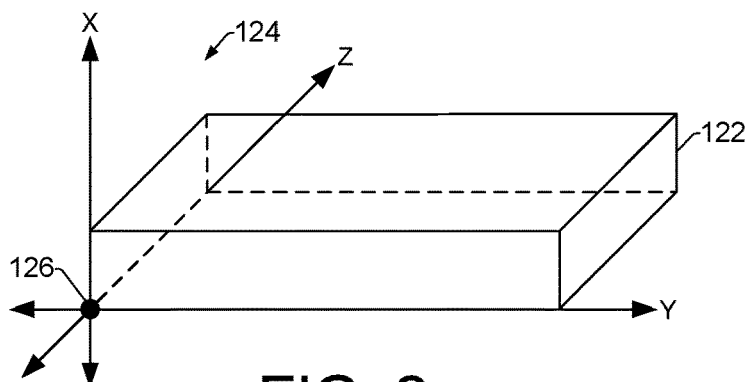
FIGS. 2, 3, 4, and 5, show different example steps in an example normalization process of an example 3D object model.

Computing attributes of an incoming 3D object model 112 can begin with a normalization process that aligns the incoming 3D object in a manner that is consistent with the alignment of the previously printed objects whose previous print recipes 118 are stored in memory 106. The normalization process to align an incoming 3D object ensures that attribute comparisons made between attributes of the incoming 3D object and previous object attributes are quantitatively equal so that attribute matches can be discovered. In some examples, normalization can be achieved through a default alignment that relies on data in the incoming 3D object model data 112. With a default alignment, an assumption is made that each incoming object is described in the same way and with the same order of voxels (voxels are discussed below with reference to FIGS. 6 and 7). Such a default alignment makes it unnecessary to determine the alignment by another normalization process. In some examples, however, a normalization process can be used to align incoming 3D objects. FIGS. 2, 3, 4, and 5, show an example of an incoming 3D object model being normalized in an example normalization process. Referring to FIG. 2, an incoming 3D object model 122 can be oriented with respect to (i.e., placed on) a 3D coordinate system 124 having X, Y, and Z axes. The incoming 3D object model 122 shown in FIGS. 2-5 as a rectangular shaped box is intended as a simple example of an incoming 3D object to help illustrate the steps of a normalization process. Actual 3D objects that may be received can comprise an infinite variety of shapes with a wide range of complexity.

Figure 3:
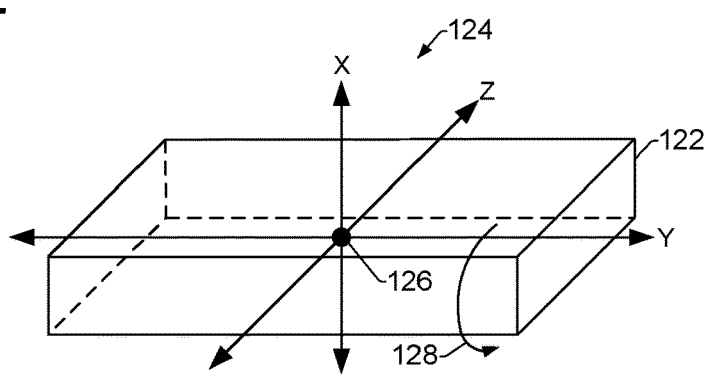
Figure 4:
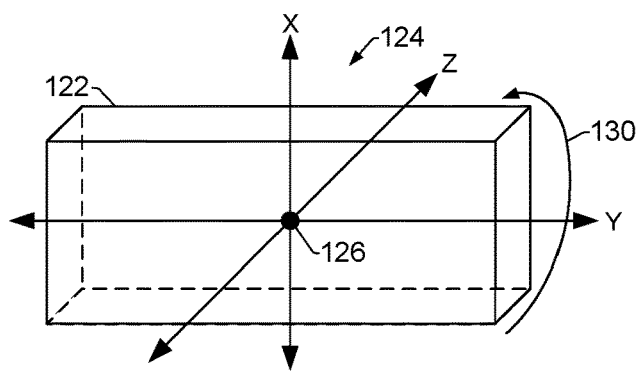
Figure 5:
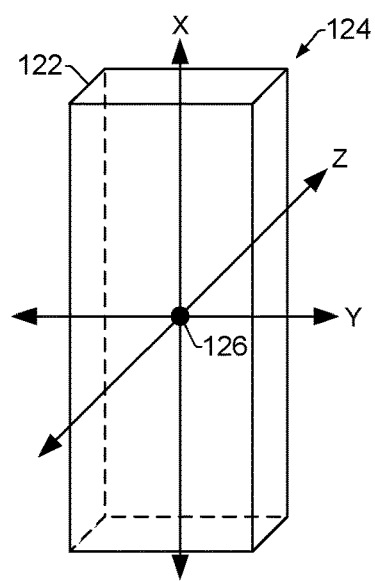
Figure 6:
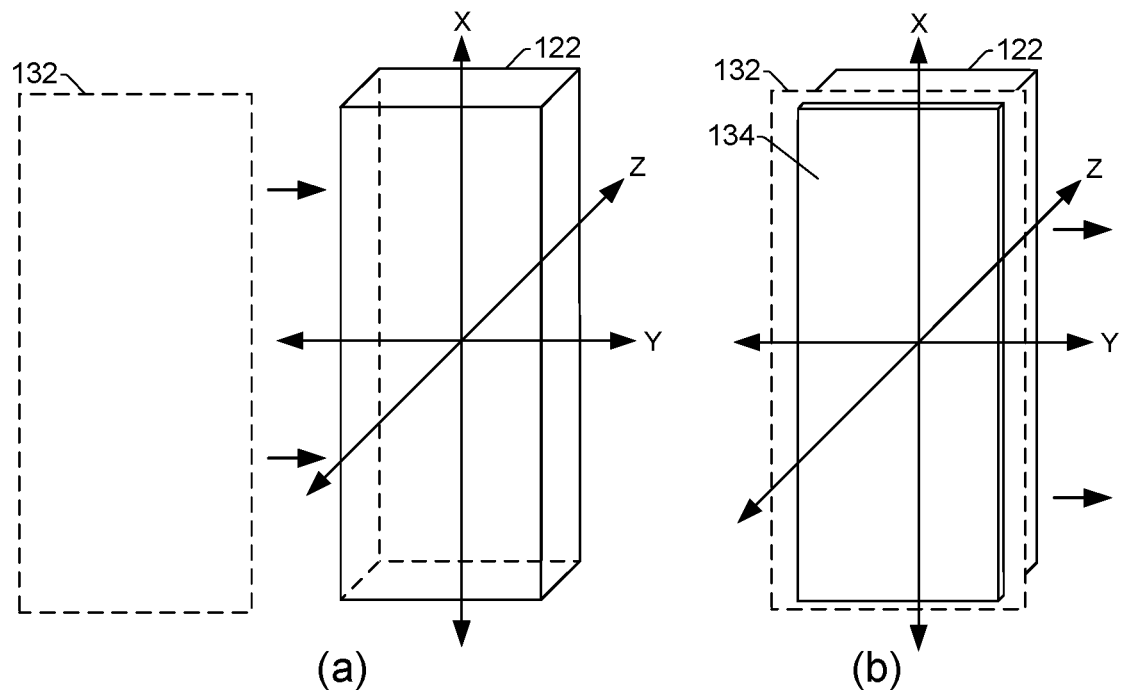
FIGS. 6a and 6b show an example representation of an imaginary plane used to slice through an 3D object to form an example object layer perpendicular to a Z axis.

Upon receiving an incoming 3D object model 122 and orienting it on a 3D coordinate system 124, the center of mass of the object can be computed. The 3D object model 122 can then be translated with respect to the coordinate system such that its center of mass is placed at the origin 126 of the coordinate system 124, as shown in FIG. 3. As further shown in FIG. 3, the object 122 can then be rotated about the origin 126 such that the shortest dimension of the object is aligned with the Z axis. FIG. 4 shows an example position of the object 122 on the coordinate system 124 after it has been rotated to minimize its Z-axis dimension. The rotation direction 128 shown in FIG. 3 is an example rotation direction, and other rotation directions may be possible and/or appropriate to minimize the Z-axis dimension of the object 122. Referring to FIGS. 4 and 5, the object 122 can then be rotated about the Z-axis such that the longest dimension of the object 122 is aligned with the X-axis. FIG. 5 shows an example position of the object 122 on the coordinate system 124 after it has been rotated to orient its longest dimension along the X-axis. The rotation direction 130 shown in FIG. 4 is an example rotation direction, and other rotation directions may be possible and/or appropriate to align the longest dimension of the object 122 with the X-axis.

Once the incoming 3D object model 122 is properly oriented on a 3D coordinate system 124, a minimum bounding box can be computed for the object. Again, while the example 3D object model 122 in FIGS. 2-5 is shown as a rectangular box, other examples of incoming 3D object models may comprise complex geometries. Thus, computing a minimum bounding box for such an incoming 3D object model determines a smallest box into which the incoming object can fit within, regardless of the shape of the object. In some examples, the bounding box for the object can then be linearly scaled such that the bounding box is a unit length.

The particular normalization alignment process discussed above is provided by way of example, and not by way of limitation. Thus, in some examples, different steps and selections within such a normalization process can be altered to achieve appropriate alignment outcomes. For example, the selection or specification of which axes are used is arbitrary so long as the relative orientations remain the same and so long as each incoming 3D object model is aligned in the same manner. Furthermore, other guides for selecting object orientation (e.g., based on desired object strength), can also be used. Such guides perform equally well in normalizing incoming 3D objects as long as the outcome is deterministic.

Figure 7:
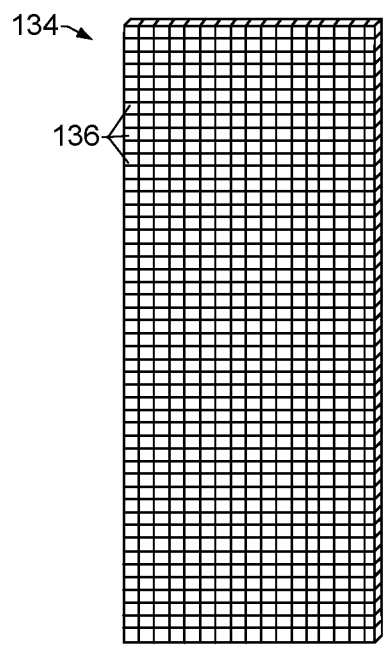
FIG. 7 shows an example of an object layer sliced with the resolution of a voxel and divided into N-by-N matrix elements; and, FIGS. 8, 9, and 10, show example flow diagrams of example methods for processing a 3D object.

After normalization, the 3D object 122 can be sliced into object layers perpendicular to the Z axis. FIGS. 6a and 6b show an example representation of an imaginary plane 132 used to slice through the 3D object 122 to form an object layer 134 that is perpendicular to the Z axis. Each Z slice object layer 134 is sliced with the resolution of a voxel 136 (FIG. 7). In general, a voxel 136 can represent a volume element of an array of elements that constitutes a three-dimensional space. Each Z slice layer 134 can be described by a matrix such that a matrix element corresponds to a voxel 136 as shown in FIG. 7. Thus, each Z slice layer 134 can be divided into N-by-N elements, or blocks (e.g., 100×100 blocks). Each matrix element or voxel can be further described by an aggregate of material properties/attributes in a predefined order.

For an incoming 3D object model 112 to be printed, various attributes can be computed. Bounding boxes, as discussed above, can be computed. Bounding boxes can include a 3D bounding box of a whole object 122, as well as 2D bounding boxes of every Z slice 134 of an object. The minimum and maximum values of each attribute of the whole object 122, every Z slice 134, and every voxel/block 136, can be computed. Value distributions of each attribute within each set of voxels 136 can be computed. For example, this can include a histogram for each property/attribute. These distributions can be computed in a hierarchical manner. For example, a histogram can be computed from an attribute of the whole object, every Z slice, and every voxel/block. For computing a distribution, the range (min., max.) of the attribute value can be divided into M uniform intervals, and if a value falls within a specific interval, the corresponding counter can be increased by one. The distribution can be normalized such that all the entries sum up to one. This normalized distribution can be viewed as a probability distribution of the corresponding attribute within a set of voxels.

Various metrics can be used to compute the distance between two measures. For example, the distance between two intervals of real values can be computed as the Hausdorff distance. The Hausdorff distance can be used to compute the distance between two intervals [v1,v2] and [v3,v4] as follows:

$$d = \max(|v_3 - v_1|, |v_4 - v_2|)$$

With this metric, the distance is zero when the two intervals completely overlap. In another example, for two normalized distributions, there are many statistical distance measures that can be used. Examples of such statistical distance measures include Euclidean, Bhattacharyya, and Earth mover's.

Having the computed attributes and the computed distance measures, a determination can be made as to whether or not an incoming 3D object is similar enough to a previously printed 3D object whose previously generated print recipe 118 is stored in memory 106. Whether two such objects are similar enough to one another can be calculated (i.e., determined) based on given error tolerances that can be supplied with the incoming 3D object model data supplied by a user. When an incoming object matches with attributes of a previously printed object, the previous print recipe 118 associated with the previously printed object can be retrieved from the store of previous print recipes in memory 106. The retrieved print recipe can then be used to control the printing of the new, incoming 3D object. When there is no match between an incoming object and any previously printed object, instructions within the print recipe module 110 can be executed to generate a new print recipe to use for printing the new, incoming 3D object.

Once an incoming 3D object has been processed, the corresponding results (e.g., attribute value distributions, etc.) can be saved in the memory 106 as part of the metadata associated with the part. Thus, the computed object attributes for the new object can be stored in memory 106 as part of the previous object attributes 116. The printing recipe associated with the new object, whether it has been retrieved based on an object match or it has been newly generated, can also be saved in the memory 106 in the previous print recipes 118. The attributes and printing recipe can be associated as a key-value pair.

Figure 8:
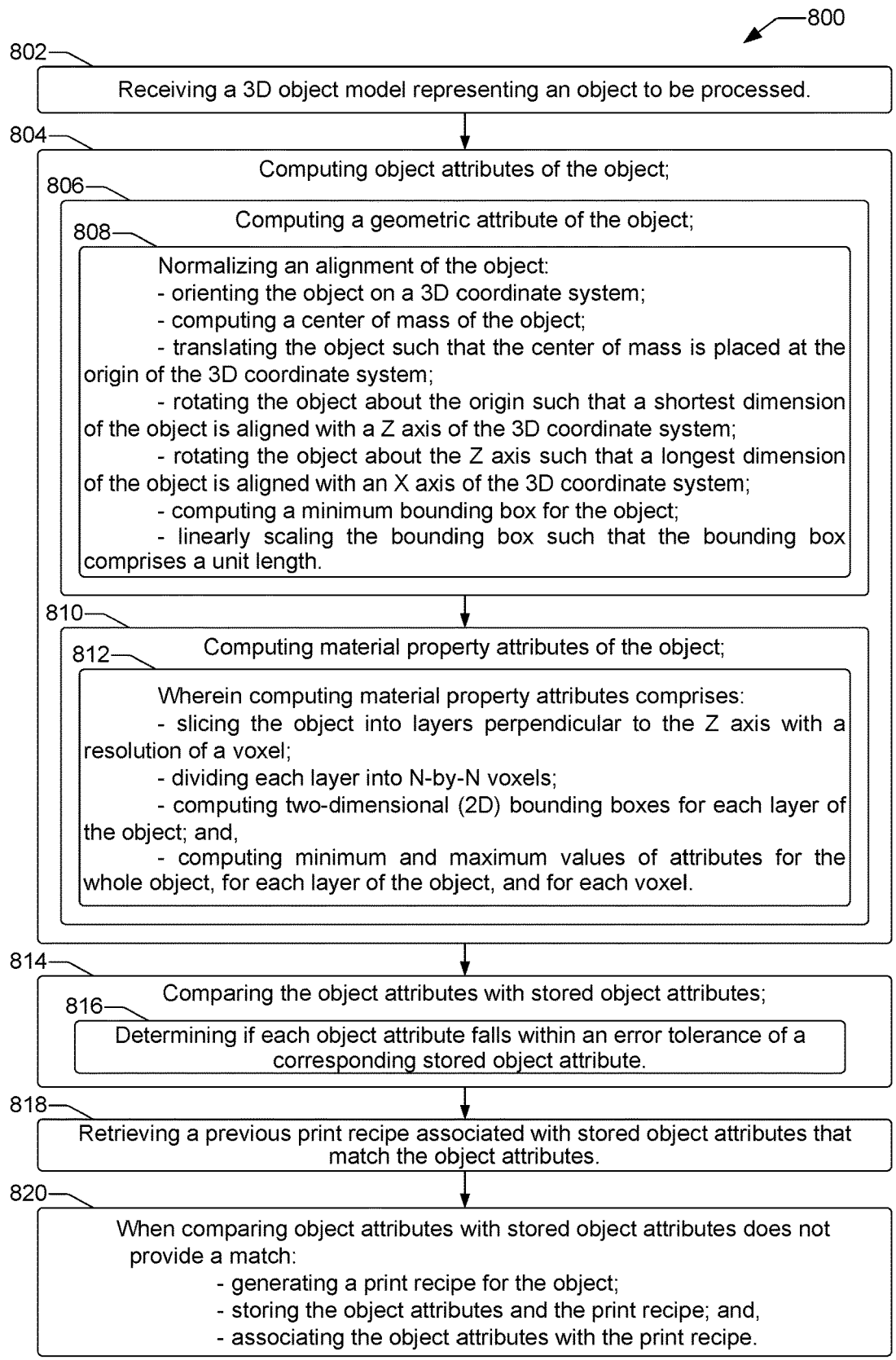
Figure 9:
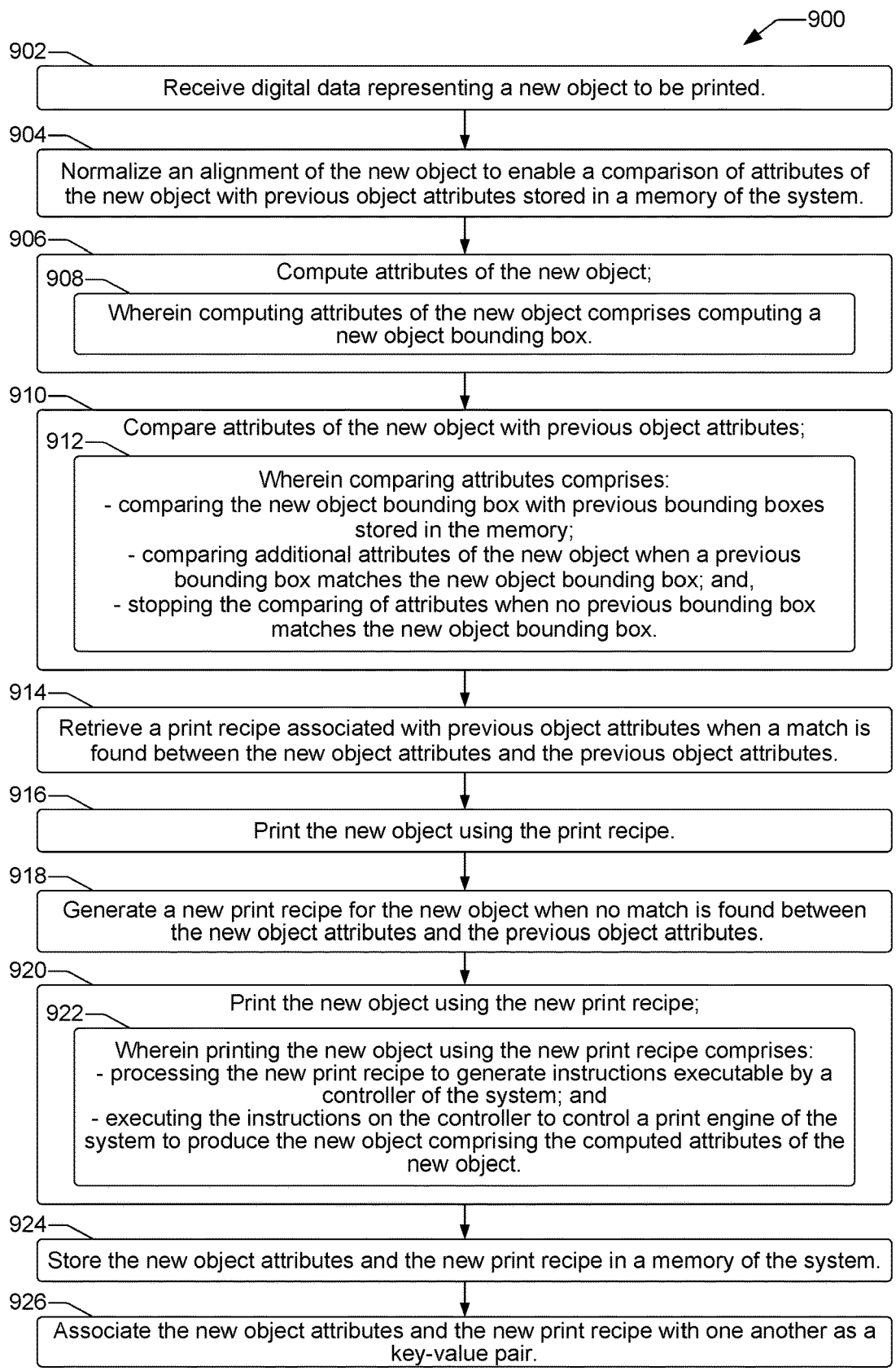
Figure 10:
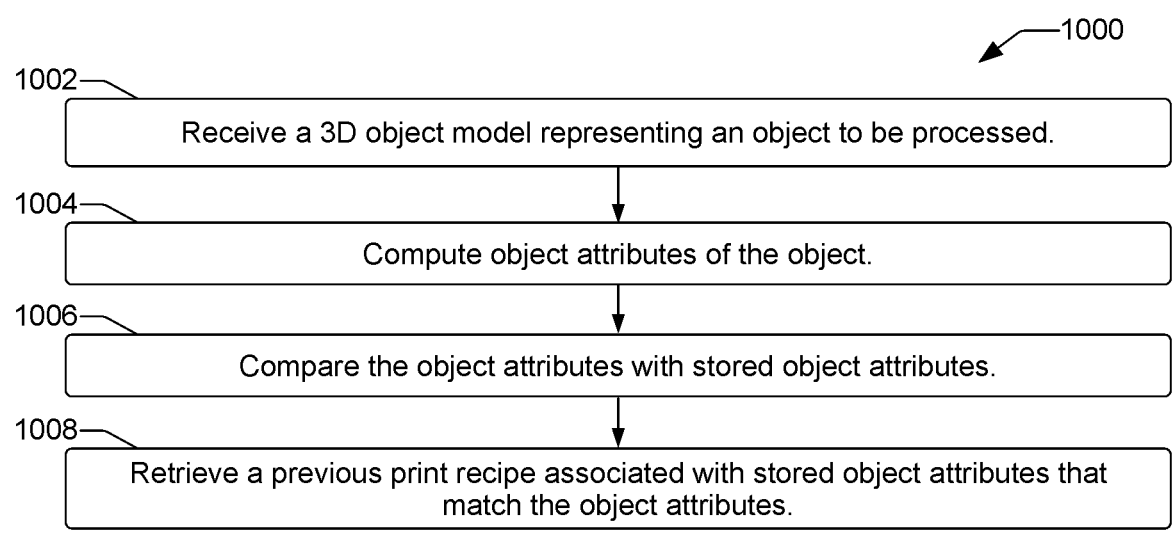

FIGS. 8, 9, and 10, are flow diagrams showing example methods 800, 900, and 1000, for processing a 3D object. Methods 800, 900, and 1000, are associated with examples discussed above with regard to FIGS. 1-7, and details of the operations shown in methods 800, 900, and 1000, can be found in the related discussion of such examples. The operations of methods 800, 900, and 1000, may be embodied as programming instructions stored on a non-transitory, machine-readable (e.g., computer/processor-readable) medium, such as memory 106 shown in FIG. 1. In some examples, implementing the operations of methods 800, 900, and 1000, can be achieved by a processor, such as a processor 104 of FIG. 1, reading and executing the programming instructions stored in a memory 106. In some examples, implementing the operations of methods 800, 900, and 1000, can be achieved using an ASIC and/or other hardware components alone or in combination with programming instructions executable by a processor 104.

The methods 800, 900, and 1000, may include more than one implementation, and different implementations of methods 800, 900, and 1000, may not employ every operation presented in the respective flow diagrams of FIGS. 8, 9, and 10. Therefore, while the operations of methods 800, 900, and 1000, are presented in a particular order within their respective flow diagrams, the order of their presentations is not intended to be a limitation as to the order in which the operations may actually be implemented, or as to whether all of the operations may be implemented. For example, one implementation of method 800 might be achieved through the performance of a number of initial operations, without performing one or more subsequent operations, while another implementation of method 800 might be achieved through the performance of all of the operations.

Referring now to the flow diagram of FIG. 8, an example method 800 of processing a 3D object begins at block 802 with receiving a 3D object model representing an object to be processed. Continuing at block 804, object attributes for the object can be computed. As shown at block 806, computing object attributes can include computing a geometric attribute of the object. Computing a geometric attribute of the object can include normalizing an alignment of the object as shown at block 808. A process for normalizing the alignment of the object, as shown at block 808, can include orienting the object on a 3D coordinate system, computing a center of mass of the object, translating the object such that the center of mass is placed at the origin of the 3D coordinate system, rotating the object about the origin such that a shortest dimension of the object is aligned with a Z axis of the 3D coordinate system, rotating the object about the Z axis such that a longest dimension of the object is aligned with an X axis of the 3D coordinate system, and computing a minimum bounding box for the object. In some examples, normalization can also include linearly scaling the bounding box such that the bounding box comprises a unit length.

Continuing at block 810, the method 800 can include computing material property attributes of the object. As shown at block 812, computing such material property attributes can include slicing the object into layers perpendicular to the Z axis with a resolution of a voxel, dividing each layer into N-by-N voxels, computing two-dimensional (2D) bounding boxes for each layer of the object, and computing minimum and maximum values of attributes for the whole object, for each layer of the object, and for each voxel.

As shown at block 814, the method 800 can include comparing the object attributes with stored object attributes. In some examples, comparing the object attributes comprises determining if each object attribute falls within an error tolerance of a corresponding stored object attribute, as shown at block 816. The method also includes retrieving a previous print recipe associated with stored object attributes that match the object attributes, as shown at block 818. When comparing object attributes with stored object attributes does not provide a match, the method further includes generating a print recipe for the object, storing the object attributes and the print recipe, and associating the object attributes with the print recipe.

Referring now to the flow diagram of FIG. 9, another example method 900 of processing a 3D object begins at block 902 with receiving a digital data representing a new object to be printed. As shown at block 904, the alignment of the new object can be normalized to enable a comparison of attributes of the new object with previous object attributes stored in a memory of the system. New object attributes can be computed, which can include computing a new object bounding box, as shown at blocks 906 and 908, respectively. As shown at block 910, attributes of the new object can be compared with previous object attributes. Comparing attributes can include, for example, comparing the new object bounding box with previous bounding boxes stored in the memory, comparing additional attributes of the new object when a previous bounding box matches the new object bounding box, and stopping the comparing of attributes when no previous bounding box matches the new object bounding box, as shown at block 912.

Continuing at block 914, a print recipe associated with previous object attributes can be retrieved when a match is found between the new object attributes and the previous object attributes. The new object can be printed using the retrieved print recipe, as shown at block 916. In some examples, as shown at block 918, when no match is found between the new object attributes and the previous object attributes, a new print recipe for the new object can be generated. The new object can then be printed using the new print recipe, as shown at block 920. Printing the new object using the new print recipe can include processing the new print recipe to generate instructions executable by a controller of the system, and executing the instructions on the controller to control a print engine of the system to produce the new object comprising the computed attributes of the new object, as shown at block 922.

The method can also include storing the new object attributes and the new print recipe in a memory of the system, and associating the new object attributes and the new print recipe with one another as a key-value pair, as shown at blocks 924 and 926, respectively.

Referring now to the flow diagram of FIG. 10, another example method 1000 of processing a 3D object begins at block 1002 with receiving a 3D object model representing an object to be processed. As shown at block 1004, the method 1000 can include computing object attributes of the object. The object attributes can then be compared with stored object attributes, as shown at block 1006. The method can then include retrieving a previous print recipe associated with stored object attributes that match the object attributes, as shown at block 1008.

What is claimed is:

1. A method of processing a 3D object, comprising:
   receiving a 3D object model representing an object to be processed;
   computing geometric and material property object attributes of the object;
   wherein computing a geometric object attribute comprises normalizing an alignment of the object through:
   orienting the object on a 3D coordinate system;
   computing a center of mass of the object;
   translating the object such that the center of mass is placed at a coordinate of the 3D coordinate system;
   rotating the object about the coordinate such that a shortest dimension of the object is aligned with a first axis of the 3D coordinate system;
   rotating the object about the first axis such that a longest dimension of the object is aligned with a second axis of the 3D coordinate system; and,
   computing a minimum bounding box for the object; and,
   wherein computing material property object attributes comprises:
   slicing the object into layers perpendicular to the first axis with a resolution of a voxel;
   dividing each layer into voxels;
   computing bounding boxes for each layer of the object; and,
   computing values of attributes for the whole object, for each layer of the object, and for each voxel;
   comparing the object attributes with stored object attributes; and,
   retrieving a previous print recipe associated with stored object attributes that match the object attributes.

2. A method as in claim 1, further comprising, when the comparing does not provide a match:
   generating a print recipe for the object;
   storing the object attributes and the print recipe; and,
   associating the object attributes with the print recipe.

3. A method as in claim 1, wherein comparing the object attributes with stored object attributes comprises determining if each object attribute falls within an error tolerance of a corresponding stored object attribute.

4. A method as in claim 1, wherein:
   the coordinate at which the center of mass is placed is the origin of the 3D coordinate system;
   the first axis is the Z axis of the 3D coordinate system; and,
   the second axis is the X axis of the 3D coordinate system.

5. A method as in claim 1, wherein normalizing an alignment of the object further comprises linearly scaling the bounding box such that the bounding box comprises a unit length.

6. A method as in claim 1, wherein:
   the first axis is the Z axis of the 3D coordinate system;
   dividing each layer into voxels comprises dividing each layer into N-by-N voxels;
   computing bounding boxes comprises computing two-dimensional (2D) bounding boxes for each layer of the object; and,
   computing values of attributes comprises computing minimum and maximum values of attributes for the whole object, for each layer of the object, and for each voxel.

7. A 3D printing system for processing a 3D object according to the method of claim 1, the system comprising:
   a memory device comprising the stored object attributes and associated previous object print recipes from previously processed 3D objects; and,
   a processor programmed with instructions from an attribute module executable to compute the object attributes and compare the object attributes with the stored object attributes and retrieve a previous object print recipe.

8. A 3D printing system as in claim 7, further comprising a 3D print engine to print a 3D object based on the retrieved previous object print recipe.

* * * * *